(12) United States Patent
Choe et al.

(10) Patent No.: US 6,737,889 B2
(45) Date of Patent: May 18, 2004

(54) METHOD FOR INCREASING THE POWER EFFICIENCY AND NOISE IMMUNITY OF CLOCKED FULL-RAIL DIFFERENTIAL LOGIC

(75) Inventors: Swee Yew Choe, Milpitas, CA (US); Edgardo F. Klass, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/226,609

(22) Filed: Aug. 23, 2002

(65) Prior Publication Data

US 2004/0036505 A1 Feb. 26, 2004

(51) Int. Cl.[7] .............................................. H03K 19/096
(52) U.S. Cl. .............................. 326/96; 326/83; 326/95; 326/113; 327/219
(58) Field of Search ............................... 326/95, 96, 97, 326/98, 83, 28, 113, 121; 327/437, 219

(56) References Cited

U.S. PATENT DOCUMENTS

| | | | | |
|---|---|---|---|---|
| 4,247,791 A | * | 1/1981 | Rovell | 307/355 |
| 5,859,548 A | * | 1/1999 | Kong | 326/113 |
| 6,211,704 B1 | * | 4/2001 | Kong | 326/121 |

* cited by examiner

Primary Examiner—Daniel D. Chang
(74) Attorney, Agent, or Firm—Gunnison, McKay & Hodgson, L.L.P.; Philip J. McKay

(57) ABSTRACT

Clocked full-rail differential logic circuits are provided with shut-off devices. The addition of the shut-off device provides a full-rail differential logic circuit with shut-off that does not experience the large pre-charge high or "dip" experienced by prior art full-rail differential logic circuits and is therefore more power efficient. In addition, the present invention provides a full-rail differential logic circuit with shut-off that is more resistant to noise than prior art full-rail differential logic circuits.

16 Claims, 4 Drawing Sheets

METHOD FOR INCREASING THE POWER EFFICIENCY AND NOISE IMMUNITY OF CLOCKED FULL-RAIL DIFFERENTIAL LOGIC

FIELD OF THE INVENTION

The present invention relates generally to logic circuits and, more particularly, to clocked full-rail differential logic circuits.

BACKGROUND OF THE INVENTION

One example of a prior art full-rail differential logic circuit is presented and discussed at page 112, and shown in FIG. 3(c), in "HIGH SPEED CMOS DESIGN STYLES" by Bernstein et al. of IBM Microelectronics; Kluwer Academic Publishers, 101 Philip Drive, Assinippi Park, Norwell, Mass., 02061; ISBN 0-7923-8220-X, hereinafter referred to as the Bernstein et al. reference, which is incorporated herein by reference, in its entirety, for all purposes.

FIG. 1 shows a prior art full-rail differential logic circuit 100 similar to that discussed in the Bernstein et al. reference. As seen in FIG. 1, prior art full-rail differential logic circuit 100 included six transistors: PFET 105, PFET 107, NFET 109, PFET 115, PFET 117 and NFET 121. Prior art full-rail differential logic circuit 100 also included: differential logic 123 with inputs 151 and 153; out terminal 111; and outBar terminal 113. Prior art full-rail differential logic circuit 100 is activated from a delayed clock signal CLKA. As shown in FIG. 1, signal CLKA was supplied to: gate 116 of PFET 115; gate 118 of PFET 117; gate 129 of NFET 109; and gate 122 of NFET 121.

Prior art full-rail differential logic circuit 100 worked reasonably well, however, during the evaluation phase, prior art full-rail differential logic circuit 100 drew excess power unnecessarily as the relevant inputs, 151 or 153, to logic network 123 were transitioning low to shut off the path of one of the complementary output terminals, out terminal 111 or outBar terminal 113, to ground. The high output terminal, out terminal 111 or outBar terminal 113, therefore experienced a "dip" during the transition when the inputs 151 or 153 switched from high to low and a short circuit current, or crossbar current, path was established from Vdd 102 to ground. This "dip" was undesirable and resulted in significant power being wasted.

In addition, the structure of prior art full-rail differential logic circuit 100 was particularly susceptible to noise. This problem was extremely undesirable, and damaging, since, typically, multiple prior art full-rail differential logic circuits 100 were cascaded in long chains (not shown) of prior art full-rail differential logic circuits 100. In these chain configurations, the susceptibility of prior art full-rail differential logic circuit 100 to noise meant that each successive stage of the chain contributed additional noise and was even more adversely affected by the noise than the previous stage. Consequently, a few stages into a chain of prior art full-rail differential logic circuits 100, noise became the dominant factor in the chain.

What is needed is a full-rail differential logic circuit that does not experience the large "dip" experienced by prior art full-rail differential logic circuit 100 and is therefore more power efficient. In addition, it is desirable to have a full-rail differential logic circuit that is more resistant to noise than prior art full-rail differential logic circuit 100.

SUMMARY OF THE INVENTION

According to the present invention, clocked full-rail differential logic circuits include shut-off devices to minimize the "dip" at the high output node that was associated with prior art clocked full-rail differential logic circuits. The shut-off device of the invention isolates the high output terminal immediately from the input terminals when the complementary output terminal is pulled to ground. Consequently, according to the present invention, the window period, or path, for the short circuit current, or crossbar current, is significantly decreased and power is saved.

In addition, since clocked full-rail differential logic circuits with shut-off include a shut-off device, the high output terminal is isolated from the input terminals and the noise immunity of the clocked full-rail differential logic circuits with shut-off of the invention is significantly better than prior art clocked full-rail differential logic circuits because noise on the input terminal does not affect the high output terminal after evaluation. Consequently, the clocked full-rail differential logic circuits with shut-off of the invention are better suited for application in cascaded chains.

As discussed above, the clocked full-rail differential logic circuits with shut-off of the invention can be cascaded together to form the chains commonly used in the industry. When the clocked full-rail differential logic circuits with shut-off of the invention are cascaded together, the advantages of the clocked full-rail differential logic circuits with shut-off of the invention are particularly evident and the gains in terms of noise immunity, power efficiency, size reduction and flexibility are further pronounced.

In particular, one embodiment of the invention is a cascaded chain of clocked full-rail differential logic circuits with shut-off. The chain includes a first clocked full-rail differential logic circuit with shut-off. The first clocked full-rail differential logic circuit with shut-off includes: a first clocked full-rail differential logic circuit with shut-off clock input terminal; at least one first clocked full-rail differential logic circuit with shut-off data input terminal; and at least one first clocked full-rail differential logic circuit with shut-off data output terminal.

The cascaded chain also includes a second clocked full-rail differential logic circuit with shut-off. The second clocked full-rail differential logic circuit with shut-off includes: a second clocked full-rail differential logic circuit with shut-off clock input terminal; at least one second clocked full-rail differential logic circuit with shut-off data input terminal; and at least one second clocked full-rail differential logic circuit with shut-off data output terminal.

According to the invention, the at least one first clocked full-rail differential logic circuit with shut-off data output terminal is coupled to the at least one second clocked full-rail differential logic circuit with shut-off data input terminal to form the chain. According to the invention, a first clock signal is coupled to the first clocked full-rail differential logic circuit with shut-off clock input terminal and a second clock signal is coupled to the second clocked full-rail differential logic circuit with shut-off clock input terminal. According to the invention, the second clock signal is delayed with respect to the first clock signal by a predetermined delay time.

In one embodiment of the invention, a delay circuit is coupled between the first clocked full-rail differential logic circuit with shut-off clock input terminal and the second clocked full-rail differential logic circuit with shut-off clock input terminal to provide the predetermined delay time.

One embodiment of the invention is a clocked full-rail differential logic circuit with shut-off that includes a clocked full-rail differential logic circuit with shut-off out terminal and a clocked full-rail differential logic circuit with shut-off outBar terminal.

In one embodiment of the invention, the clocked full-rail differential logic circuit with shut-off also includes a first node, the first node is coupled to a first supply voltage.

In one embodiment of the invention, the clocked full-rail differential logic circuit with shut-off also includes a first transistor, the first transistor including a first transistor first flow electrode, a first transistor second flow electrode and a first transistor control electrode. The first node is coupled to the first transistor first flow electrode and the first transistor second flow electrode is coupled to the clocked full-rail differential logic circuit with shut-off out terminal. The first transistor can also include a back bias input terminal having a back bias voltage thereon.

In one embodiment of the invention, the clocked full-rail differential logic circuit with shut-off also includes a second transistor, the second transistor including a second transistor first flow electrode, a second transistor second flow electrode and a second transistor control electrode. The first node is coupled to the second transistor first flow electrode and the second transistor second flow electrode is coupled to the clocked full-rail differential logic circuit with shut-off outBar terminal.

In one embodiment of the invention, the clocked full-rail differential logic circuit with shut-off also includes a third transistor, the third transistor including a third transistor first flow electrode, a third transistor second flow electrode and a third transistor control electrode. The first transistor control electrode is coupled to the third transistor first flow electrode and the clocked full-rail differential logic circuit with shut-off outBar terminal. The second transistor control electrode is coupled to the third transistor second flow electrode and the clocked full-rail differential logic circuit with shut-off out terminal. The third transistor control electrode is coupled to a clock signal CLKA.

In one embodiment of the invention, the clocked full-rail differential logic circuit with shut-off also includes a fourth transistor, the fourth transistor including a fourth transistor first flow electrode, a fourth transistor second flow electrode and a fourth transistor control electrode. The first node is coupled to the fourth transistor first flow electrode and the fourth transistor second flow electrode is coupled to the clocked full-rail differential logic circuit with shut-off out terminal. The fourth transistor control electrode is coupled to the clock signal CLKA. The fourth transistor can also include a back bias input terminal having a back bias voltage thereon.

In one embodiment of the invention, the clocked full-rail differential logic circuit with shut-off also includes a fifth transistor, the fifth transistor including a fifth transistor first flow electrode, a fifth transistor second flow electrode and a fifth transistor control electrode. The first node is coupled to the fifth transistor first flow electrode and the fifth transistor second flow electrode is coupled to the clocked full-rail differential logic circuit with shut-off outBar terminal. The fifth transistor control electrode is coupled to the clock signal CLKA. The fifth transistor can also include a back bias input terminal having a back bias voltage thereon.

In one embodiment of the invention, the clocked full-rail differential logic circuit with shut-off also includes a shut-off device coupled between the clocked full-rail differential logic circuit with shut-off out terminal and the clocked full-rail differential logic circuit with shut-off outBar terminal and the logic network out terminal and logic network outBar terminal.

In one embodiment of the invention, the clocked full-rail differential logic circuit with shut-off shut-off device includes a sixth transistor, the sixth transistor including a sixth transistor first flow electrode, a sixth transistor second flow electrode and a sixth transistor control electrode. The fourth transistor second flow electrode is coupled to the sixth transistor first flow electrode. The sixth transistor second flow electrode is coupled to the logic network out terminal. The sixth transistor control electrode is coupled to the third transistor first flow electrode and the clocked full-rail differential logic circuit with shut-off outbar terminal.

In one embodiment of the invention, the clocked full-rail differential logic circuit with shut-off shut-off device also includes a seventh transistor, the seventh transistor including a seventh transistor first flow electrode, a seventh transistor second flow electrode and a seventh transistor control electrode. The fifth transistor second flow electrode is coupled to the seventh transistor first flow electrode. The seventh transistor second flow electrode is coupled to the logic network outBar terminal. The seventh transistor control electrode is coupled to the third transistor second flow electrode and the clocked full-rail differential logic circuit with shut-off out terminal.

In one embodiment of the invention, the clocked full-rail differential logic circuit with shut-off also includes a logic network, the logic network including at least one logic network input terminal, a logic network out terminal and a logic network outBar terminal. The logic network out terminal is coupled to the clocked full-rail differential logic circuit with shut-off out terminal and the logic network outbar terminal is coupled to the clocked full-rail differential logic circuit with shut-off outBar terminal.

In one embodiment of the invention, the clocked full-rail differential logic circuit with shut-off also includes a eighth transistor, the eighth transistor including a eighth transistor first flow electrode, a eighth transistor second flow electrode and a eighth transistor control electrode. The eighth transistor first flow electrode is coupled to the logic network. The eighth transistor control electrode is coupled to the clock signal CLKA. The eighth transistor second flow electrode is coupled to the second supply voltage.

The present invention provides a full-rail differential logic circuit with shut-off that does not experience the large "dip" experienced by prior art full-rail differential logic circuits and is therefore more power efficient. In addition, the present invention provides a full-rail differential logic circuit with shut-off that is more resistant to noise than prior art full-rail differential logic circuits.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1:
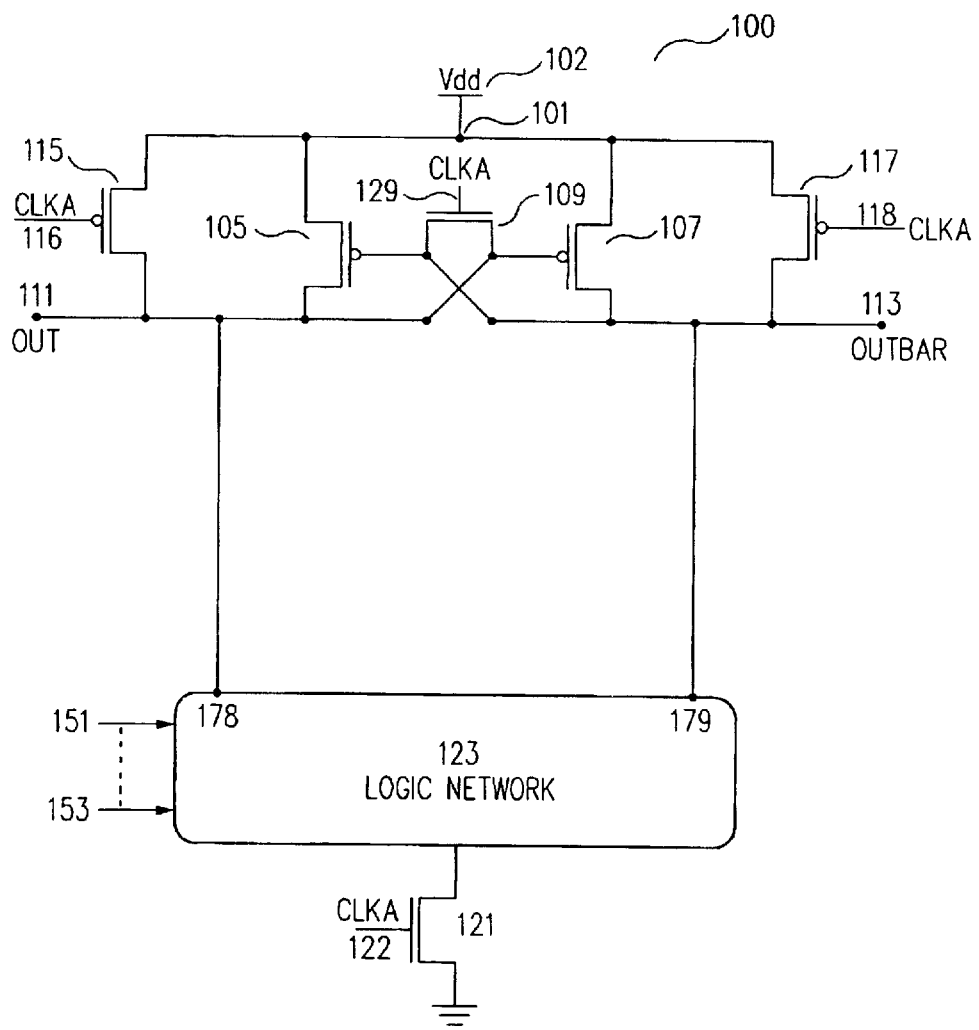
FIG. 1 shows a schematic diagram of a prior art full-rail differential logic circuit.

According to the present invention, clocked full-rail differential logic circuits (200 in FIG. 2 and 300A, 300B, 300C and 300N in FIG. 3) include shut-off devices (280 in FIG. 2) to minimize the "dip" at the high output node (211 or 215 in FIG. 2) that was associated with prior art clocked full-rail differential logic circuits (100 in FIG. 1). The shut-off device of the invention isolates the high output terminal immediately from the input terminals (251 and 253 in FIG. 2) when the complementary output terminal (213 or 211 in FIG. 2) is pulled to ground. Consequently, according to the present invention, the window period, or path, for the short circuit current, or crossbar current, is significantly decreased and power is saved.

In addition, since clocked full-rail differential logic circuits with shut-off include a shut-off device, the high output terminal is isolated from the input terminals and the noise immunity of the clocked full-rail differential logic circuits with shut-off of the invention is significantly better than prior art clocked full-rail differential logic circuits because noise on the input terminal does not affect the high output terminal after evaluation. Consequently, the clocked full-rail differential logic circuits with shut-off of the invention are better suited for application in cascaded chains (301 in FIG. 3).

As discussed above, the clocked full-rail differential logic circuits with shut-off of the invention can be cascaded together to form the chains (301 in FIG. 3) commonly used in the industry. When the clocked full-rail differential logic circuits with shut-off of the invention are cascaded together, the advantages of the clocked full-rail differential logic circuits with shut-off of the invention are particularly evident and the gains in terms of noise immunity, power efficiency, size reduction and flexibility are further pronounced.

Figure 2:
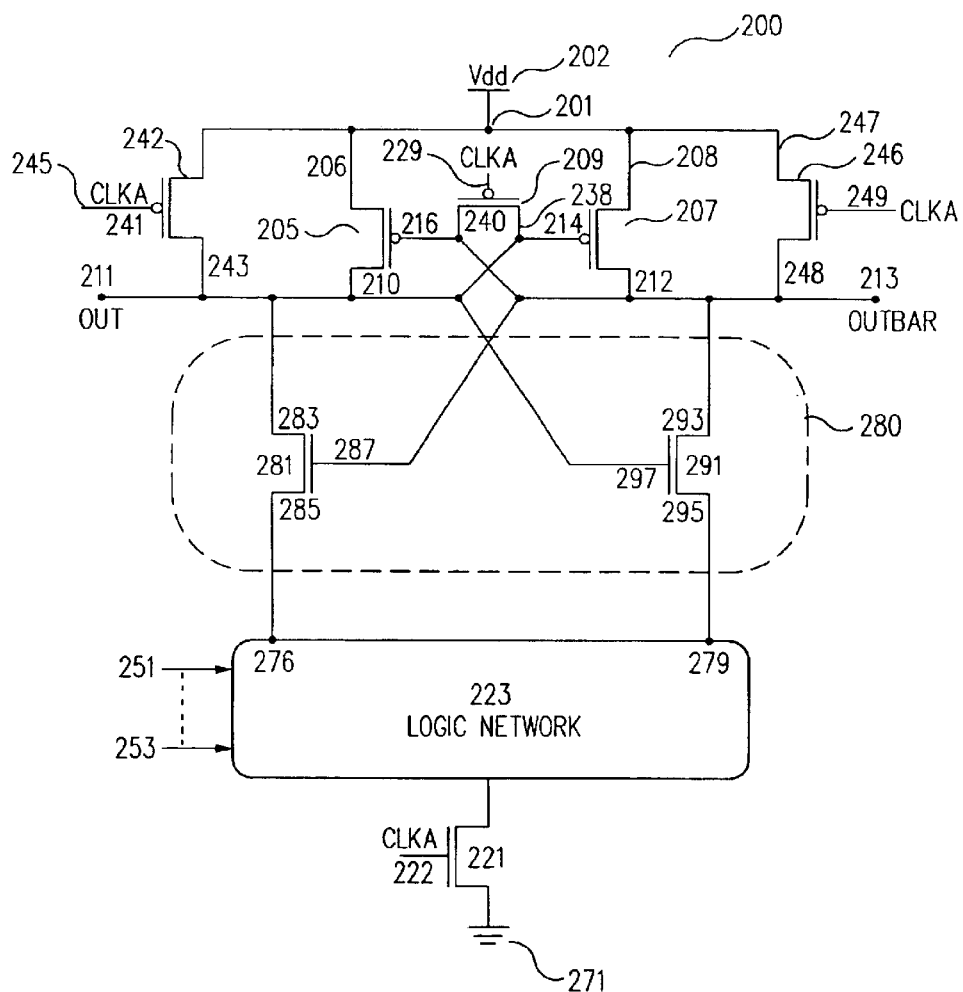
FIG. 2 shows a schematic diagram of one embodiment of a clocked full-rail differential logic circuit with shut-off designed according to the principles of the present invention.

FIG. 2 shows a schematic diagram of one embodiment of a clocked full-rail differential logic circuit with shut-off 200 designed according to the principles of the present invention. As seen in FIG. 2, clocked full-rail differential logic circuit with shut-off 200 includes a first supply voltage 202 coupled to a first node 201. First node 201 is coupled to: a source 206 of a first transistor, PFET 205; a source 208 of a second transistor, PFET 207; a source 242 of a fourth transistor, PFET 241 and a source 247 of a fifth transistor, PFET 246. The clock signal CLKA is coupled to: a control electrode or gate 245 of PFET 241; a control electrode or gate 249 of PFET 246; a control electrode or gate 229 of a third transistor, PFET 209; a control electrode or gate 222 of a eighth transistor, NFET 221.

A control electrode or gate 216 of PFET 205 is coupled to a source 240 of PFET 209 and an outbar terminal 213. A control electrode or gate 214 of PFET 207 is coupled to a drain 238 of PFET 209 and an out terminal 211. A drain 210 of PFET 205 is coupled to out terminal 211 and a drain 212 of PFET 207 is coupled to outBar terminal 213.

As discussed above, gate 245 of PFET 241 is coupled to clock signal CLKA, as is gate 249 of PFET 246. A drain 243 of PFET 241 is coupled to out terminal 211 and a drain 248, of PFET 249 is coupled to outBar terminal 213.

According to the invention, clocked full-rail differential logic circuit with shut-off 200 also includes shut-off device 280. In one embodiment of the invention, shut-off device 280 includes a sixth transistor, NFET 281 including a drain 283, a source 285 and a control electrode or gate 287. Drain 210 of PFET 205 is coupled to drain 283 of NFET 281. Source 285 of NFET 281 is coupled to an out terminal 276 of a logic network 223. Gate 287 of NFET 281 is coupled to source 240 of PFET 209 and clocked full-rail differential logic circuit with shut-off outBar terminal 213.

In one embodiment of the invention, shut-off device 280 also includes a seventh transistor, NFET 291 including a drain 293, a source 295 and a control electrode or gate 297. Drain 212 of PFET 207 is coupled to drain 293 of NFET 291. Source 295 of NFET 291 is coupled to an outBar terminal 279 of logic network 223. Gate 297 of NFET 291 is coupled to drain 238 of PFET 209 and clocked full-rail differential logic circuit with shut-off out terminal 211.

In one embodiment of the invention, clocked full-rail differential logic circuit with shut-off 200 also includes a logic network 223. In one embodiment of the invention, logic network 223 is an NMOS pass transistor logic network including input terminals 251 and 253. As noted above, logic network out terminal 276 is coupled to source 285 of NFET 281 and logic network outBar terminal 279 is coupled to source 295 of NFET 291. In other embodiments of the invention, logic network 223 includes any type of differential logic and/or circuitry used in the art including various logic gates, logic devices and circuits.

A particular embodiment of a clocked full-rail differential logic circuit with shut-off 200 according to the invention is shown in FIG. 2. Those of skill in the art will recognize that clocked full-rail differential logic circuit with shut-off 200 can be easily modified. For example, different transistors, i.e., PFETs 205, 207, 209, 241, and 246 or NFETs 281, 291, and 221 can be used. In particular, the NFETs and PFETS shown in FIG. 2 can be readily exchanged for PFETs and NFETs by reversing the polarities of the supply voltages 202 and 271, or by other well known circuit modifications. Consequently, the clocked full-rail differential logic circuit with shut-off 200 that is shown in FIG. 2 is simply one embodiment of the invention used for illustrative purposes only and does not limit the present invention to that one embodiment of the invention.

As discussed above, Clock signal CLKA is coupled to: gate 245 of PFET 241; gate 229 of PFET 209; gate 249 of PFET 246 and gate 222 of NFET 221. The addition of shut-off device 280, according to the present invention, allows clocked full-rail differential logic circuit with shut-off 200 to minimize the "dip" at the high output terminal 211 or 213 that was associated with prior art clocked full-rail differential logic circuits (100 in FIG. 1). In operation, during the pre-charge phase, i.e., when signal CLKA is low, PFETs 241 and 246 charge the respective low output of either clocked full-rail differential logic circuit with shut-off out terminal 211 or clocked full-rail differential logic circuit with shut-off outBar terminal 213 to supply voltage 201, typically Vdd. PFET 209 is optional and is included to speed up pre-charge by shorting clocked full-rail differential logic circuit with shut-off out terminal 211 and clocked full-rail differential logic circuit with shut-off outBar terminal 213. During pre-charge, PFETs 205 and 207 are off and shut-off device NFETs 281 and 291 are on, or conduct.

During evaluation, i.e., when signal CLKA is high, NFET 221 conducts and PFETs 241, 209, and 246 are off. In this phase, one of clocked full-rail differential logic circuit with shut-off out terminal 211 or clocked full-rail differential logic circuit with shut-off outBar terminal 213 is discharged through logic network 223 and the other one of clocked full-rail differential logic circuit with shut-off outBar terminal 213 or clocked full-rail differential logic circuit with shut-off out terminal 211 is pulled up to first supply voltage 201, typically Vdd, after experiencing a slight dip caused by the input terminals 251 and/or 253 continuing to transition low. Whichever one of the shut-off device NFETs 281 and 291 is controlled by the low terminal, i.e., either clocked full-rail differential logic circuit with shut-off out terminal 211 or clocked full-rail differential logic circuit with shut-off outBar terminal 213, will then turn off and isolate the complementary high terminal, i.e., clocked full-rail differential logic circuit with shut-off outBar terminal 213 or clocked full-rail differential logic circuit with shut-off out terminal 211. Whichever one of either clocked full-rail differential logic circuit with shut-off out terminal 211 or clocked full-rail differential logic circuit with shut-off outBar terminal 213 is low, that low terminal will also cause one of either PFET 205 or 207 to turn on or conduct. Consequently, the cross-coupled connection of PFETs 205 and 207 provides a latch-like function to maintain the voltage level after evaluation.

In short, shut-off device 280 of the invention isolates the high output terminal (211 or 213) immediately from the input terminals (251 and 253) when the complementary output terminal (213 or 211) is pulled to ground. Consequently, according to the present invention, the window period, or path, for the short circuit current, or crossbar current, is significantly decreased and power is saved.

In addition, since clocked full-rail differential logic circuits with shut-off 200 include shut-off device 280, the high output terminal (211 or 213) is isolated from input terminals (251 and 253) and the noise immunity of clocked full-rail differential logic circuits with shut-off 200 of the invention is significantly better than prior art clocked full-rail differential logic circuits because noise on input terminals (251 and 253) does not affect the high output terminal (211 or 213) after evaluation. Consequently, clocked full-rail differential logic circuits with shut-off 200 of the invention are better suited for application in cascaded chains.

As discussed above, clocked full-rail differential logic circuit with shut-off 200 can be cascaded together with other clocked full-rail differential logic circuits with shut-off 200 to form the chains commonly used in the industry. When clocked full-rail differential logic circuits with shut-off 200 of the invention are cascaded together, the advantages of clocked full-rail differential logic circuit with shut-off 200 is particularly evident and the gains in terms of efficiency, size reduction and flexibility are further pronounced. When clocked full-rail differential logic circuits with shut-off 200 of the invention are cascaded together, the delayed clock signal CLKA is, according to the invention, timed to be at least the delay of the previous clocked full-rail differential logic circuit with shut-off 200 (not shown) to ensure each clocked full-rail differential logic circuit with shut-off 200 of the invention is switched or "fired" only after it has received an input from the previous clocked full-rail differential logic circuit with shut-off 200.

Figure 3:
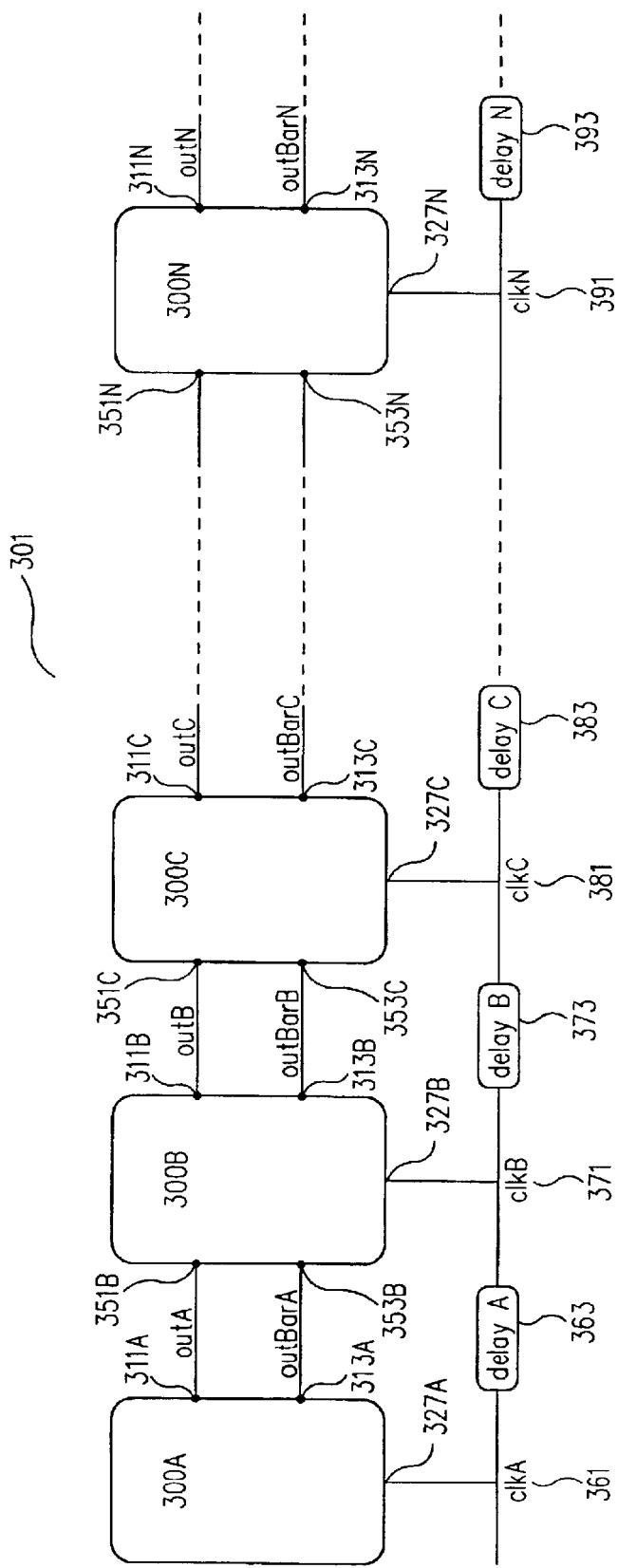
FIG. 3 shows one embodiment of a cascaded chain of clocked full-rail differential logic circuits with shut-off according to the principles of the present invention.

FIG. 3 shows one embodiment of a cascaded chain 301 of clocked full-rail differential logic circuits with shut-off 300A, 300B, and 300C and 300N of the present invention. Each clocked full-rail differential logic circuit with shut-off 300A, 300B, 300C and 300N represents a stage in cascaded chain 301. In one embodiment of the invention, each clocked full-rail differential logic circuit with shut-off 300A, 300B, 300C and 300N is similar to clocked full-rail differential logic circuit with shut-off 200 discussed above with respect to FIG. 2.

As seen in FIG. 3, clocked full-rail differential logic circuit with shut-off 300A includes: a clock input terminal 327A; an out terminal 311A; and an outBar terminal 313A. Clocked full-rail differential logic circuit with shut-off 300B includes: a clock input terminal 327B; an input terminal 351B, coupled to out terminal 311A of clocked full-rail differential logic circuit with shut-off 300A; an inputBar terminal 353B, coupled to outBar terminal 313A of clocked full-rail differential logic circuit with shut-off 300A; an output terminal 311B; and an outBar terminal 313B. Likewise, clocked full-rail differential logic circuit with shut-off 300C includes: a clock input terminal 327C; an input terminal 351C, coupled to output terminal 311B of clocked full-rail differential logic circuit with shut-off 300B; an inputBar terminal 353C, coupled to outBar terminal 313B of clocked full-rail differential logic circuit with shut-off 300B; an output terminal 311C; and an outBar terminal 313C. Clocked full-rail differential logic circuit with shut-off 300N includes: a clock input terminal 327N; an input terminal 351N, coupled to an output terminal 311N-1 (not shown) of a clocked full-rail differential logic circuit with shut-off 300N-1 (not shown); an inputBar terminal 353N, coupled to an outBar terminal 313N-1 (not shown) of a clocked full-rail differential logic circuit with shut-off 300N-1 (not shown); an output terminal 311N; and an outBar terminal 313N.

According to the invention, any number of clocked full-rail differential logic circuits with shut-off 300A, 300B, 300C and 300N can be employed with cascaded chain 301. As also shown in FIG. 3, and discussed above, output terminal 311A of clocked full-rail differential logic circuit with shut-off 300A couples signal OUTA to input terminal 351B of clocked full-rail differential logic circuit with shut-off 300B and outBar terminal 313A of clocked full-rail differential logic circuit with shut-off 300A couples signal OUTBARA to inputBar terminal 353B of clocked full-rail differential logic circuit with shut-off 300B. Likewise, output terminal 311B of clocked full-rail differential logic circuit with shut-off 300B couples signal OUTB to input terminal 351C of clocked full-rail differential logic circuit with shut-off 300C and outBar terminal 313B of clocked full-rail differential logic circuit with shut-off 300B couples signal OUTBARB to inputBar terminal 353C of clocked full-rail differential logic circuit with shut-off 300C. In addition, output terminal 311N of clocked full-rail differential logic circuit with shut-off 300N couples signal OUTN to an input terminal 351N+1 (not shown) of a clocked full-rail differential logic circuit with shut-off 300N+1 (not shown) and outBar terminal 313N of clocked full-rail differential logic circuit with shut-off 300N couples signal OUTBARN to an inputBar terminal 353N+1 (not shown) of a clocked full-rail differential logic circuit with shut-off 300N+1 (not shown).

In addition to the structure discussed above, according to the invention, each clocked full-rail differential logic circuit with shut-off 300A, 300B, 300C and 300N of cascaded chain 301 receives its own delayed clock signal CLKA 361, CLKB 371, CLKC 381 and CLKN 391, respectively. According to the invention clock signals CLKA 361, CLKB 371, CLKC 381 and CLKN 391 are provided to clocked full-rail differential logic circuits with shut-off 300A, 300B, 300C and 300N, respectively, by introducing delay circuits 363, 373, 383 and 393 between successive clocked full-rail differential logic circuits with shut-off 300A, 300B, 300C and 300N. Consequently, delay circuit 363 introduces a delay time between signal CLKA 361, coupled to clock input terminal 327A of clocked full-rail differential logic circuit with shut-off 300A, and signal CLKB 371, coupled to clock input terminal 327B of clocked full-rail differential logic circuit with shut-off 300B. Delay circuit 373 introduces a delay time between signal CLKB 371 and signal CLKC 381, coupled to clock input terminal 327C of clocked full-rail differential logic circuit with shut-off 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to clock input terminal 327N of clocked full-rail differential logic circuit with shut-off 300N, and a further delay circuit 393 introduces a further delay time between CLKN 391 and CLK N+1 (not shown) coupled to a clock input terminal 327N+1 (not shown) of a clocked full-rail differential logic circuit with shut-off 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each clocked full-rail differential logic circuit with shut-off 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to clocked full-rail differential logic circuit with shut-off 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

Figure 4:
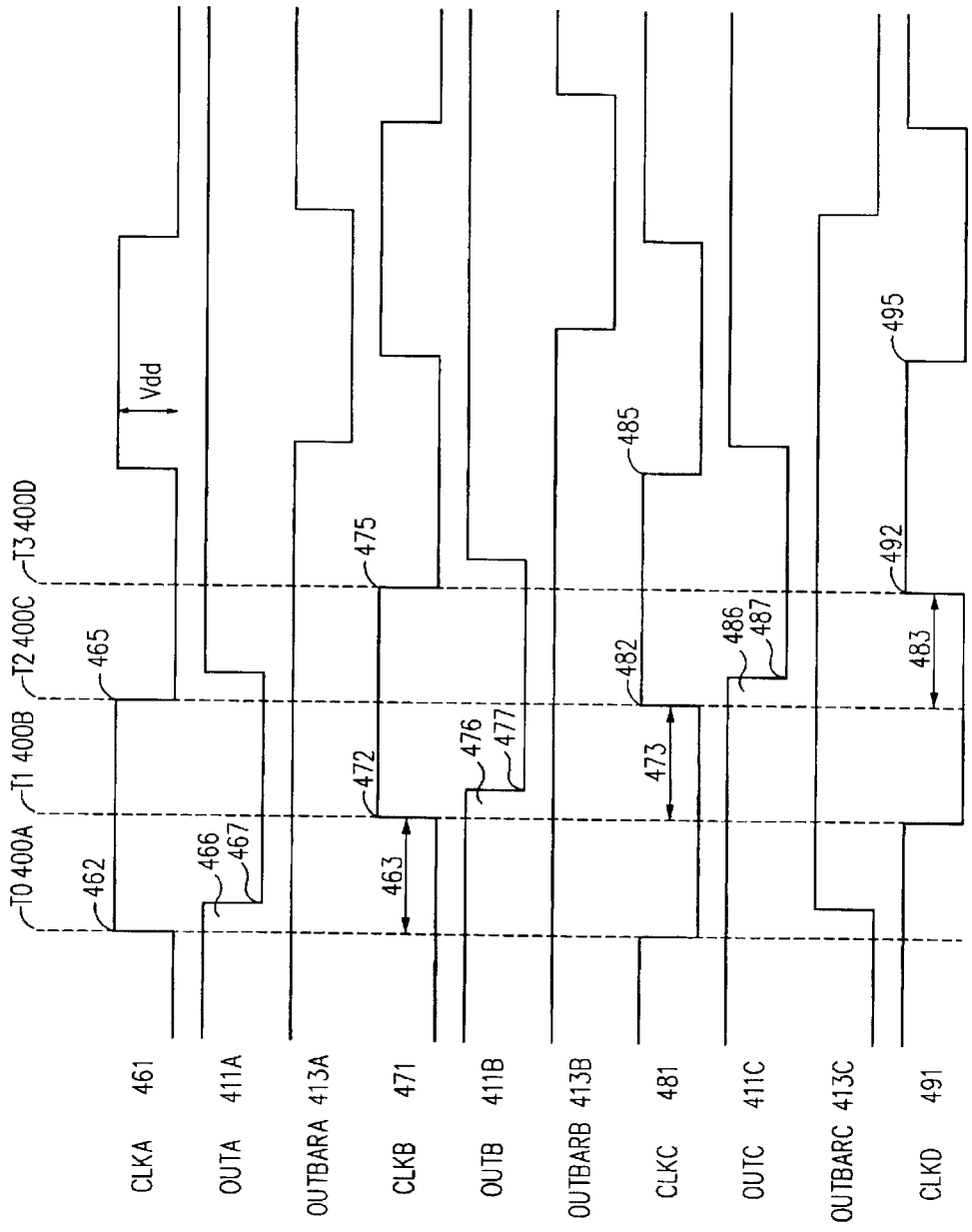
FIG. 4 is a one embodiment of a timing diagram for the cascaded chain of clocked full-rail differential logic circuits with shut-off of the invention shown in FIG. 3.

FIG. 4 is one embodiment of a timing diagram for cascaded chain 301 of clocked full-rail differential logic circuits with shut-off 300A, 300B, and 300C and 300N of FIG. 3. As seen in FIG. 3 and FIG. 4 together, according to one embodiment of the invention, at time T0, i.e., point 400A in FIG. 4, signal CLKA 461 goes high. After a short switching delay 466, such as the short switching delay inherent in any circuit, signal OUTA 411A at out terminal 311A switches low at point 467 and signal OUTBARA at outBar terminal 313A remains high. A delay time 463 from point T0 400A and to point T1 400B is introduced by delay circuit 363. As discussed above, delay time 463 helps ensure clocked full-rail differential logic circuit with shut-off 300B receives signals OUTA and OUTBARA from clocked full-rail differential logic circuit with shut-off 300A before the switching of signal CLKB 471.

At point 472 in FIG. 4, i.e., at point T1 400B, signal CLKB 471 switches high. After a short switching delay 476, signal OUTB 411B at out terminal 311B switches low at point 477 and signal OUTBARB at outBar terminal 313B remains high. A delay time 473 from point T1 400B to point T2 400C is introduced by delay circuit 373. As discussed above, delay time 473 helps ensure clocked full-rail differential logic circuit with shut-off 300C receives signals OUTB and OUTBARB from clocked full-rail differential logic circuit with shut-off 300B before the switching of signal CLKC 481.

At point 482 in FIG. 4, i.e., at point T2 400C, signal CLKC 481 switches high. After a short switching delay 486, signal OUTC 411C at out terminal 311C switches low at point 487 and signal OUTBARC at outBar terminal 313C remains high. A delay time 483 from point T2 400C to point T3 400D is introduced by delay circuit 383. As discussed above, delay time 483 helps ensure the following clocked full-rail differential logic circuit with shut-off (not shown) receives signals OUTC and OUTBARC from clocked full-rail differential logic circuit with shut-off 300C before the switching of signal CLKD 491.

At point 492 in FIG. 4, i.e., at point T3 400D, signal CLKD 491 switches high.

As discussed above, according to the invention, any number of clocked full-rail differential logic circuits with shut-off 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As discussed above, according to the present invention, clocked full-rail differential logic circuits include shut-off devices to minimize the "dip" at the high output node that was associated with prior art clocked full-rail differential logic circuits. The shut-off device of the invention isolates the high output terminal immediately from the input terminals when the complementary output terminal is pulled to ground. Consequently, according to the present invention, the window period, or path, for the short circuit current, or crossbar current, is significantly decreased and power is saved.

In addition, since clocked full-rail differential logic circuits with shut-off include a shut-off device, the high output terminal is isolated from the input terminals and the noise immunity of the clocked full-rail differential logic circuits with shut-off of the invention is significantly better than prior art clocked full-rail differential logic circuits because noise on the input terminal does not affect the high output terminal after evaluation. Consequently, the clocked full-rail differential logic circuits with shut-off of the invention are better suited for application in cascaded chains.

As discussed above, the clocked full-rail differential logic circuits with shut-off of the invention can be cascaded together to form the chains commonly used in the industry. When the clocked full-rail differential logic circuits with shut-off of the invention are cascaded together, the advantages of the clocked full-rail differential logic circuits with shut-off of the invention are particularly evident and the gains in terms of noise immunity, power efficiency, size reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A method for increasing the power efficiency and noise immunity of clocked full-rail differential logic comprising:

forming a cascaded chain of clocked full-rail differential logic circuits with shut-off, said cascaded chain of clocked full-rail differential logic circuits with shut-off comprising:

a first supply voltage;

a second supply voltage;

a first clocked full-rail differential logic circuit with shut-off, said first clocked full-rail differential logic circuit with shut-off comprising:

a first clocked full-rail differential logic circuit with shut-off out terminal;

a first clocked full-rail differential logic circuit with shut-off outbar terminal;

a first clocked full-rail differential logic circuit with shut-off first node, said first clocked full-rail differential logic circuit with shut-off first node being coupled to said first supply voltage;

a first transistor, said first transistor comprising a first transistor first flow electrode, a first transistor second flow electrode and a first transistor control electrode, said first clocked full-rail differential logic circuit with shut-off first node being coupled to said first transistor first flow electrode, said first transistor second flow electrode being coupled to said first clocked full-rail differential logic circuit with shut-off out terminal;

a second transistor, said second transistor comprising a second transistor first flow electrode, a second transistor second flow electrode and a second transistor control electrode, said first clocked full-rail differential logic circuit with shut-off first node being coupled to said second transistor first flow electrode, said second transistor second flow electrode being coupled to said first clocked full-rail differential logic circuit with shut-off outBar terminal;

a third transistor, said third transistor comprising a third transistor first flow electrode, a third transistor second flow electrode and a third transistor control electrode, said first transistor control electrode being coupled to said third transistor first flow electrode and said first clocked full-rail differential logic circuit with shut-off outBar terminal, said second transistor control electrode being coupled to said third transistor second flow electrode and said first clocked full-rail differential logic circuit with shut-off out terminal;

a fourth transistor, said fourth transistor comprising a fourth transistor first flow electrode, a fourth transistor second flow electrode and a fourth transistor control electrode; said fourth transistor first flow electrode being coupled to said first clocked full-rail differential logic circuit with shut-off first node, said fourth transistor second flow electrode being coupled to said first clocked full-rail differential logic circuit with shut-off out terminal, said fourth transistor control electrode being coupled to a first clock signal;

a fifth transistor, said fifth transistor comprising a fifth transistor first flow electrode, a fifth transistor second flow electrode and a fifth transistor control electrode; said fifth transistor first flow electrode being coupled to said first clocked full-rail differential logic circuit with shut-off first node, said fifth transistor second flow electrode being coupled to said first clocked full-rail differential logic circuit with shut-off outBar terminal, said fifth transistor control electrode being coupled to said first clock signal;

a first clocked full-rail differential logic circuit with shut-off shut-off device coupled between said first clocked full-rail differential logic circuit with shut-off out terminal and said first clocked full-rail differential logic circuit with shut-off outBar terminal;

a logic network, said logic network comprising:

at least one logic network input terminal; a logic network out terminal; and a logic network outBar terminal, said logic network out terminal being coupled to said first clocked full-rail differential logic circuit with shut-off shut-off device and said logic network outBar terminal being coupled to said first clocked full-rail differential logic circuit with shut-off shut-off device;

a second clocked full-rail differential logic circuit with shut-off, said second clocked full-rail differential logic circuit with shut-off comprising:

a second clocked full-rail differential logic circuit with shut-off out terminal;

a second clocked full-rail differential logic circuit with shut-off outBar terminal;

a second clocked full-rail differential logic circuit with shut-off first node, said second clocked full-rail differential logic circuit with shut-off first node being coupled to said first supply voltage;

a first transistor, said first transistor comprising a first transistor first flow electrode, a first transistor second flow electrode and a first transistor control electrode, said second clocked full-rail differential logic circuit with shut-off first node being coupled to said first transistor first flow electrode, said first transistor second flow electrode being coupled to said second clocked full-rail differential logic circuit with shut-off out terminal;

a second transistor, said second transistor comprising a second transistor first flow electrode, a second transistor second flow electrode and a second transistor control electrode, said second clocked full-rail differential logic circuit with shut-off first node being coupled to said second transistor first flow electrode, said second transistor second flow electrode being coupled to said second clocked full-rail differential logic circuit with shut-off outBar terminal;

a third transistor, said third transistor comprising a third transistor first flow electrode, a third transistor second flow electrode and a third transistor control electrode, said first transistor control electrode being coupled to said third transistor first flow electrode and said second clocked full-rail differential logic circuit with shut-off outBar terminal, said second transistor control electrode being coupled to said third transistor second flow electrode and said second clocked full-rail differential logic circuit with shut-off out terminal;

a fourth transistor, said fourth transistor comprising a fourth transistor first flow electrode, a fourth transistor second flow electrode and a fourth transistor control electrode; said fourth transistor first flow electrode being coupled to said second clocked full-rail differential logic circuit with shut-off first node, said fourth transistor second flow electrode being coupled to said second clocked full-rail differential logic circuit with shut-off out terminal, said fourth transistor control electrode being coupled to said a second clock signal;

a fifth transistor, said fifth transistor comprising a fifth transistor first flow electrode, a fifth transistor second flow electrode and a fifth transistor control electrode; said fifth transistor first flow electrode being coupled to said second clocked full-rail differential logic circuit with shut-off first node, said fifth transistor second flow electrode being coupled to said second clocked full-rail differential logic circuit with shut-off outBar terminal, said fifth transistor control electrode being coupled to said second clock signal;

a second clocked full-rail differential logic circuit with shut-off shut-off device coupled between said second clocked full-rail differential logic circuit with shut-off out terminal and said second clocked full-rail differential logic circuit with shut-off outBar terminal;

a logic network, said logic network comprising:

at least one logic network input terminal; a logic network out terminal; and a logic network outBar terminal, said logic network out terminal being coupled to said second clocked full-rail differential logic circuit with shut-off shut-off device and said logic network outBar terminal being coupled to said second clocked full-rail differential logic circuit with shut-off shut-off device; and;

delaying said second clock signal with respect to said first clock signal by a predetermined delay time.

2. The method for increasing the power efficiency and noise immunity of clocked full-rail differential logic of claim 1, wherein;

said first clocked full-rail differential logic circuit with shut-off shut-off device comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to said out terminal of said logic network, said sixth transistor control electrode being coupled to said third transistor first flow electrode and said first clocked full-rail differential logic circuit with shut-off outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said outBar terminal of said logic network, said seventh transistor control electrode being coupled to said third transistor second flow electrode and said first clocked full-rail differential logic circuit with shut-off out terminal, further wherein;

said second clocked full-rail differential logic circuit with shut-off shut-off device comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to said out terminal of said logic network, said sixth transistor control electrode being coupled to said third transistor first flow electrode and said second clocked full-rail differential logic circuit with shut-off outBar terminal;

a seventh transistor, said seventh transistor comprising a seventh transistor first flow electrode, a seventh transistor second flow electrode and a seventh transistor control electrode, said second transistor second flow electrode being coupled to said seventh transistor first flow electrode, said seventh transistor second flow electrode being coupled to said outBar terminal of said logic network, said seventh transistor control electrode being coupled to said third transistor second flow electrode and said second clocked full-rail differential logic circuit with shut-off out terminal.

3. The method for increasing the power efficiency and noise immunity of clocked full-rail differential logic of claim 2, wherein;

said logic network of said first clocked full-rail differential logic circuit with shut-off and said logic network of said second clocked full-rail differential logic circuit with shut-off comprise differential logic.

4. The method for increasing the power efficiency and noise immunity of clocked full-rail differential logic of claim 2, wherein;

said logic network of said first clocked full-rail differential logic circuit with shut-off and said logic network of said second clocked full-rail differential logic circuit with shut-off comprise differential logic gates.

5. The method for increasing the power efficiency and noise immunity of clocked full-rail differential logic of claim 2, wherein;

said logic network of said first clocked full-rail differential logic circuit with shut-off and said logic network of said second clocked full-rail differential logic circuit with shut-off comprise NMOS pass transistor logic;

said logic network of said first clocked full-rail differential logic circuit with shut-off comprises at least one control variable input and at least one pass variable input; and said logic network of said second clocked full-rail differential logic circuit with shut-off comprises at least one control variable input and at least one pass variable input.

6. The method for increasing the power efficiency and noise immunity of clocked full-rail differential logic of claim 2, wherein;

said first supply voltage is Vdd and said second supply voltage is ground.

7. The method for increasing the power efficiency and noise immunity of clocked full-rail differential logic of claim 6, wherein;

said first transistor, said second transistor, said third transistor, said fourth transistor and said fifth transistor of said first clocked full-rail differential logic circuit with shut-off and said first transistor, said second transistor, said third transistor, said fourth transistor and said fifth transistor of said second clocked full-rail differential logic circuit with shut-off are PFETs.

8. The method for increasing the power efficiency and noise immunity of clocked full-rail differential logic of claim 7, wherein;

said sixth transistor and said seventh transistor of said first clocked full-rail differential logic circuit with shut-off and said sixth transistor and said seventh transistor of said second clocked full-rail differential logic circuit with shut-off are NFETs.

9. A method for increasing the power efficiency and noise immunity of a clocked full-rail differential logic circuit comprising:

providing a first supply voltage;

providing a second supply voltage;

providing a clocked full-rail differential logic circuit with shut-off out terminal;

providing a clocked full-rail differential logic circuit with shut-off outBar terminal;

providing a clocked full-rail differential logic circuit with shut-off first node;

coupling said clocked full-rail differential logic circuit with shut-off first node to said first supply voltage;

providing a first transistor, said first transistor comprising a first transistor first flow electrode, a first transistor second flow electrode and a first transistor control electrode;

coupling said clocked full-rail differential logic circuit with shut-off first node to said first transistor first flow electrode;

coupling said first transistor second flow electrode to said clocked full-rail differential logic circuit with shut-off out terminal;

providing a second transistor, said second transistor comprising a second transistor first flow electrode, a second transistor second flow electrode and a second transistor control electrode;

coupling said clocked full-rail differential logic circuit with shut-off first node to said second transistor first flow electrode;

coupling said second transistor second flow electrode to said clocked full-rail differential logic circuit with shut-off outBar terminal;

providing a third transistor, said third transistor comprising a third transistor first flow electrode, a third transistor second flow electrode and a third transistor control electrode;

coupling said first transistor control electrode to said third transistor first flow electrode and said clocked full-rail differential logic circuit with shut-off outBar terminal;

coupling said second transistor control electrode to said third transistor second flow electrode and said clocked full-rail differential logic circuit with shut-off out terminal;

providing a fourth transistor, said fourth transistor comprising a fourth transistor first flow electrode, a fourth transistor second flow electrode and a fourth transistor control electrode;

coupling said fourth transistor first flow electrode to said clocked full-rail differential logic circuit with shut-off first node;

coupling said fourth transistor second flow electrode to said clocked full-rail differential logic circuit with shut-off out terminal;

coupling said fourth transistor control electrode to a first clock signal;

providing a fifth transistor, said fifth transistor comprising a fifth transistor first flow electrode, a fifth transistor second flow electrode and a fifth transistor control electrode;

coupling said fifth transistor first flow electrode to said clocked full-rail differential logic circuit with shut-off first node;

coupling said fifth transistor second flow electrode to said clocked full-rail differential logic circuit with shut-off outBar terminal;

coupling said fifth transistor control electrode to said first clock signal;

providing a clocked full-rail differential logic circuit with shut-off shut-off device;

coupling said clocked full-rail differential logic circuit with shut-off shut-off device between said clocked full-rail differential logic circuit with shut-off out terminal and said clocked full-rail differential logic circuit with shut-off outBar terminal;

providing a logic network, said logic network comprising: at least one logic network input terminal; a logic network out terminal; and a logic network outBar terminal;

coupling said logic network out terminal to said clocked full-rail differential logic circuit with shut-off shut-off device;

coupling said logic network outBar terminal to said clocked full-rail differential logic circuit with shut-off shut-off device; and, delaying a second clock signal with respect to said first clock signal by a predetermined time.

10. The method for increasing the power efficiency and noise immunity of clocked full-rail differential logic circuit of claim 9, wherein;

providing said clocked full-rail differential logic circuit with shut-off with a shut-off device comprises:

providing a sixth transistor, said sixth transistor comprising a sixth transistor first flow electrode, a sixth transistor second flow electrode and a sixth transistor control electrode;

coupling said first transistor second flow electrode to said sixth transistor first flow electrode;

coupling said sixth transistor second flow electrode to said out terminal of said logic network;

coupling said sixth transistor control electrode to said third transistor first flow electrode and said clocked full-rail differential logic circuit with shut-off outBar terminal;

providing a seventh transistor, said seventh transistor comprising a seventh transistor first flow electrode, a seventh transistor second flow electrode and a seventh transistor control electrode;

coupling said second transistor second flow electrode to said seventh transistor first flow electrode;

coupling said seventh transistor second flow electrode to said outBar terminal of said logic network; and, coupling said seventh transistor control electrode to said third transistor second flow electrode and said clocked full-rail differential logic circuit with shut-off out terminal.

11. The method for increasing the power efficiency and noise immunity of clocked full-rail differential logic circuit of claim 10, wherein;

said logic network of said clocked full-rail differential logic circuit with shut-off comprises differential logic.

12. The method for increasing the power efficiency and noise immunity of clocked full-rail differential logic circuit of claim 11, wherein;

said logic network of said clocked full-rail differential logic circuit with shut-off comprises differential logic gates.

13. The method for increasing the power efficiency and noise immunity of clocked full-rail differential logic circuit of claim 11, wherein;

said logic network of said clocked full-rail differential logic circuit with shut-off comprises NMOS pass transistor logic; and said logic network of said clocked full-rail differential logic circuit with shut-off includes at least one control variable input and at least one pass variable input.

14. The method for increasing the power efficiency and noise immunity of clocked full-rail differential logic circuit of claim 11, wherein;

said first supply voltage is Vdd and said second supply voltage is ground.

15. The method for increasing the power efficiency and noise immunity of clocked full-rail differential logic circuit of claim 14, wherein;

said first transistor, said second transistor, said third transistor, said fourth transistor and said fifth transistor are PFETs.

16. The method for increasing the power efficiency and noise immunity of clocked full-rail differential logic circuit of claim 15, wherein;

said sixth transistor and said seventh transistor are NFETs.

* * * * *